United States Patent
Elers

(10) Patent No.: US 7,727,864 B2
(45) Date of Patent: Jun. 1, 2010

(54) CONTROLLED COMPOSITION USING PLASMA-ENHANCED ATOMIC LAYER DEPOSITION

(75) Inventor: Kai-Erik Elers, Vantaa (FI)

(73) Assignee: ASM America, Inc., Phoenix, AZ (US)

(*) Notice: Subject to any disclaimer, the term of this patent is extended or adjusted under 35 U.S.C. 154(b) by 555 days.

(21) Appl. No.: 11/591,927

(22) Filed: Nov. 1, 2006

(65) Prior Publication Data

US 2008/0102613 A1    May 1, 2008

(51) Int. Cl.
   *H01L 21/3065* (2006.01)
(52) U.S. Cl. .................. 438/485; 438/788; 438/792
(58) Field of Classification Search .............. None
   See application file for complete search history.

(56) References Cited

U.S. PATENT DOCUMENTS

| | | | |
|---|---|---|---|
| 4,058,430 | A | 11/1977 | Suntola et al. |
| 5,711,811 | A | 1/1998 | Suntola et al. |
| 6,373,111 | B1 | 4/2002 | Zheng et al. |
| 6,458,695 | B1 | 10/2002 | Lin et al. |
| 6,506,676 | B2 | 1/2003 | Park et al. |
| 6,518,106 | B2 | 2/2003 | Ngai et al. |
| 6,955,986 | B2 * | 10/2005 | Li ........................ 438/687 |
| 7,045,406 | B2 * | 5/2006 | Huotari et al. .......... 438/198 |
| 7,338,901 | B2 * | 3/2008 | Ishizaka ................. 438/680 |
| 7,494,937 | B2 * | 2/2009 | Clark ..................... 438/778 |
| 7,541,284 | B2 | 6/2009 | Park |
| 2002/0008257 | A1 | 1/2002 | Barnak et al. |
| 2004/0106261 | A1 | 6/2004 | Huotari et al. |
| 2004/0142557 | A1 | 7/2004 | Levy et al. |
| 2004/0231799 | A1 | 11/2004 | Lee et al. |
| 2006/0019495 | A1 | 1/2006 | Marcadal et al. |

FOREIGN PATENT DOCUMENTS

WO    WO 96/17107    6/1996

OTHER PUBLICATIONS

1988RD-0296076 (Nov. 20, 1998) "Field effect transistor structure with improved transconductance—contg. spacer-less conducting gate oxide, and tungsten deposited on source and drain," Sep. 19, 2005, EAST Version 2.0.1.4. Patent-Assigneee: Anonymous[Anon].

* cited by examiner

*Primary Examiner*—Zandra Smith
*Assistant Examiner*—Pamela E Perkins
(74) *Attorney, Agent, or Firm*—Knobbe, Martens, Olson & Bear, LLP

(57) ABSTRACT

Metallic-compound films are formed by plasma-enhanced atomic layer deposition (PEALD). According to preferred methods, film or thin film composition is controlled by selecting plasma parameters to tune the oxidation state of a metal (or plurality of metals) in the film. In some embodiments, plasma parameters are selected to achieve metal-rich metallic-compound films. The metallic-compound films can be components of gate stacks, such as gate electrodes. Plasma parameters can be selected to achieve a gate stack with a predetermined work function.

32 Claims, 7 Drawing Sheets

CONTROLLED COMPOSITION USING PLASMA-ENHANCED ATOMIC LAYER DEPOSITION

REFERENCE TO RELATED APPLICATIONS

The present application is related to U.S. patent application Ser. No. 10/430,703 to Huotari et al., filed May 5, 2003, now U.S. Pat. No. 7,045,406, the disclosure of which is incorporated entirely by reference herein.

FIELD OF THE INVENTION

The present invention relates generally to the deposition of metallic-compound films or thin films and more particularly to atomic layer deposition (ALD) for the field of semiconductor manufacturing.

BACKGROUND OF THE INVENTION

Semiconductor devices are continuously improved to enhance device performance. For example, both smaller device size and higher speed of operation are highly desirable performance targets. Transistors have also been continuously reduced in size to lower the power consumption and to increase the clocking frequency. By constructing smaller gate structures for complementary metal oxide silicon (CMOS) transistors, it becomes possible to pack more transistors on the same surface area. The reduction in the size of the gate structures has led to a substantial decrease of the electrical thickness of the gate dielectric to 3 nanometers (nm) and less.

The main elements of a typical MOS semiconductor device are shown in FIG. 1. The device generally includes a semiconductor substrate 101, on which a gate stack is disposed. The gate stack comprises a gate dielectric layer 110 and a gate electrode 114 disposed on the gate dielectric layer 110. The gate electrode 114 acts as a conductor. An input signal is typically applied to the gate electrode 114 via a gate terminal (not shown). Lightly doped drain (LDD) regions 103 reduce the electric field near the drain edge and thus reduce the incidence of hot carrier generation. Spacers 111, usually consisting of an insulating oxide or nitride, are formed on the gate sidewalls. Then, heavily doped source/drain regions 102 are formed in the semiconductor substrate 101 and are later connected to source/drain terminals (not shown).

With continued reference to FIG. 1, a channel region 116 is formed in the semiconductor substrate beneath the gate dielectric 110 and it separates source/drain regions 102. The channel region 116 is typically lightly doped with a dopant of a type opposite to that of the source/drain regions 102. The gate electrode 114 is separated from the semiconductor substrate 101 by the gate dielectric layer 110. The insulating gate dielectric layer 110 is provided to prevent current from flowing between the gate electrode 114 and the source/drain regions 102 or the channel region 116. The properties of the transistor critically depend on the thickness and quality of the gate dielectric layer 110.

In a CMOS device, opposite type NMOS 300 and PMOS 350 transistors are present as shown in FIG. 2. By applying a voltage to the gate electrodes 314, 364 of the transistors, channel regions 316, 366 become electrically conductive in the lightly-doped substrate regions beneath the gate dielectrics 310, 360. The transistor switches from a non-conductive state into a conductive state at the threshold voltage that is applied to the gate electrode. In order to keep the threshold voltages of the transistors small and, hence, to keep the power consumption of the transistors low, the work function of the gate electrode material should be approximately equal to the work function of the substrate material underneath the gate electrode.

P-type and N-type substrate materials have significantly different work functions. Traditionally, the work function matching was achieved by using polysilicon as gate electrode material and by doping the polysilicon with a dopant of the same type as the substrate material directly underneath the gate electrode. However, in current technology, polysilicon is no longer adequate because of its relatively low conductivity and because of depletion effects. Depletion takes place in the semiconducting polysilicon at the interface between the gate electrode and the gate dielectric, increasing the equivalent oxide thickness (EOT) of the gate dielectric. On the other hand, the solubility of the dopants of the polysilicon is limited to about $5 \times 10^{20}$ atoms/cm$^3$. The solubility restricts the amount of charge carriers formed in polysilicon. Therefore, nowadays more conductive materials, such as refractory metals (e.g., tungsten) are preferred. In practice, metallic materials have infinite amount of carriers ($5 \times 10^{22}$ atoms/cm$^3$) and therefore the thickness of depletion region is virtually zero. This leads to a decrease of 4-5 Å of the EOT of the gate dielectric.

The most important property of the metal gate is its work function, which together with the doping level of the substrate determines the threshold voltage of the metal oxide semiconductor device. The work function of the metal electrode material should be about 4.0 to 4.2 eV in current designs for NMOS field effect transistors (FETs) and about 5.0 to 5.2 eV in current designs for PMOS FETs.

Thus, a need exists for adjusting the work function of the conductor. Factors that can influence the work function of the metal electrode material include the deposition method of the metal electrode, heat treatments carried out after the deposition (i.e. rapid thermal annealing), the thickness of the metal electrode layer, the gate oxide material used and the crystal orientations of the electrode material. The influence of the heat treatments on the work function of the electrode material is possibly due to crystallization of the materials or, for example, to emission of stoichiometrically superfluous nitrogen or some other element from the material during heat treatment. When a metal is oxidized or nitridized its average electronegativity is increased. Since work functions scale with electronegativity, the increase of electronegativity also increases the work function.

Attempts have been made to modify the work functions of metal gate materials by doping after the metal gate film deposition. However, work functions of metal gate materials after doping are not easily predictable and controllable. Doping of the gate material after the deposition can change not only the stoichiometry of the film but also the crystal orientation of the films (Q. Lu et al., Symp. VLSI Tech. (2001) 45-46 and U.S. Pat. Application No. 2002/0008257 A1).

Methods of adjusting the work function of an electrode are known in the art. For example, U.S. Pat. No. 6,458,695 B1 discloses a method of adjusting the work function by controlling the composition of the material. The publication describes the deposition of metal gates followed by oxidizing or oxygen implanting the metal gate electrode for one or both types of transistors so that an alloy is formed of the metal and its conductive oxide, the alloy having a desired work function. As another example, U.S. Pat. No. 6,506,676 discloses a method of changing the work function of an electrode comprising titanium, aluminum and nitrogen by changing the composition of $(Ti_xAl_y)_{1-z}N_z$. According to the method disclosed therein, the work function is adjusted by changing the nitrogen content of the electrode. As another example, U.S.

Pat. No. 6,518,106 discloses a method of changing the composition of a gate electrode in a transistor with ALD by changing the material concentration of one element in the gate electrode. According to the method disclosed therein, the work function of a metal gate layer depends on the concentration of silicon or nitrogen in layers that contain metal, silicon and nitrogen (e.g., TaSiN). Atomic layer deposition (ALD), chemical vapor deposition (CVD) and physical vapor deposition (PVD) have been disclosed as examples of methods for depositing the metal gate layer. However, a method avoiding local concentration variations over the substrate is not disclosed.

Ru—Ta-alloys have also been studied for use as gate electrodes. The work function of the ruthenium-tantalum metal electrodes can be adjusted to a value between 4.2 and 5.1 eV by using different Ru—Ta compositions. The work function of metal electrodes containing more ruthenium was close to 5 eV and an electrode with the composition $Ru_{0.60}Ta_{0.40}$ had a work function of about 4.3 eV (H. Zhong et al. Appl. Phys. Lett. 78 (2001) 1134-1136). However, the electrodes were formed by physical vapor deposition (PVD), resulting in sputtering damage on the gate stack dielectric layer and, furthermore, causing non-uniformities in electrical and physical properties of ultra-thin films over the substrate.

Tuning of the work function of an electrode can also be achieved by a two-layer electrode structure, each layer having a different work function, as described in a U.S. Pat. No. 6,373,111. When the bottom electrode layer is thin, such as below 3 nm, the work function of the electrode structure will primarily be determined by, and be equal to, the work function of the top layer. When the bottom layer is thick, such as above 10 nanometers (nm), the work function of the electrode structure will primarily be determined by, and equal to, the work function of the bottom layer. In a transition region, with bottom layer thicknesses between about 3 nm and 10 nm, the work function of the electrode structure can be adjusted between the work function of the top layer and the work function of the bottom layer by adjusting the thickness of the bottom film.

A problem associated with the known methods of tuning the work function of a gate stack is that adequate control of film composition, uniformities and profiles, or thickness cannot be achieved. Further, subjecting the gate electrode material to an oxidizing ambient subjects the gate dielectric material also to the oxidizing ambient, which might detrimentally affect the dielectric material and oxidize the underlying substrate material.

Therefore, there is a need for a method of adjusting the work function of a gate electrode material in a gate stack that avoids the above-described disadvantages.

SUMMARY OF THE INVENTION

It is an object of the present invention to provide an improved method of depositing an integrated circuit, in which method the composition, hence the work function of the gate electrode can be easily and accurately adjusted to a desired value.

According to one aspect of the invention, a method of determining a deposition recipe for a metallic-compound film is disclosed. The method comprises the steps of selecting plasma parameters, depositing the metallic-compound film by a plasma-enhanced atomic layer deposition (PEALD) process using the plasma parameters, and repeating the aforesaid steps with different plasma parameters until the metallic-compound film of desired composition is achieved.

According to another aspect of the invention, a method of designing a deposition process for forming a gate stack is disclosed. The method comprises selecting plasma parameters, depositing a metallic-compound film over a dielectric layer by a plasma-enhanced atomic layer deposition (PEALD) process using the plasma parameters, and repeating the aforesaid steps with different plasma parameters. Plasma parameters are selected to form the gate stack with a predetermined work function.

According to yet another aspect of the invention, a method of depositing a metallic-compound film in a plasma-enhanced atomic layer deposition (PEALD) process is disclosed. The method comprises alternately and sequentially contacting a substrate in a reaction space with spatially and temporally separated vapor phase pulses of at least three different reactants, the at least three different reactants comprising: a metal source chemical, a plasma-excited species and a source chemical of a species desired in the metallic-compound film. Plasma parameters for generating the plasma-excited species are selected to achieve the metallic-compound film with a predetermined composition. In one embodiment, the composition is selected for controlling the work function of a transition metal gate electrode.

According to yet another aspect of the invention, an atomic layer deposition (ALD) process for growing a thin metallic-compound film is disclosed. The process comprises alternately and sequentially contacting a substrate in a reaction space with spatially and temporally separated vapor phase pulses of a precursor of a metal that forms no more than about one monolayer of adsorbed species on an exposed surface of the substrate, the adsorbed species comprising at least one type of metal; a plasma-excited species reacting with the metal; and a source chemical of a species to be incorporated in the thin metallic-compound film, wherein plasma parameters are selected such that the stoichiometric ratio between the metal and the species in the thin metallic-compound film is greater than one.

According to yet another aspect of the invention, a plasma-enhanced atomic layer deposition (PEALD) process for depositing a metallic-compound film is disclosed. The process comprises alternately and sequentially contacting a substrate in a reaction space with spatially and temporally separated vapor phase pulses of at least two different reactants. The at least two different reactants comprise a metal source chemical and a second source chemical comprising plasma-excited species. Plasma parameters are selected to achieve the metallic-compound film with a predetermined composition.

According to yet another aspect of the invention, a reactor is provided. The reactor comprises a reaction space, one or more gas flow passages and a controller. The controller is configured to control pulsing of a metal precursor and plasma-excited species to form a metallic-compound film of predetermined composition over a substrate in an atomic layer deposition (ALD) sequence. Plasma parameters are set by the controller to control the extent of reduction of an adsorbed species of the metal precursor in order to form the predetermined composition. In illustrated embodiments, the predetermined composition is non-stoichiometric or metal-rich.

For purposes of summarizing the invention and the advantages achieved over the prior art, certain objects and advantages of the invention have been described above and as further described below. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENTS

Figure 1:
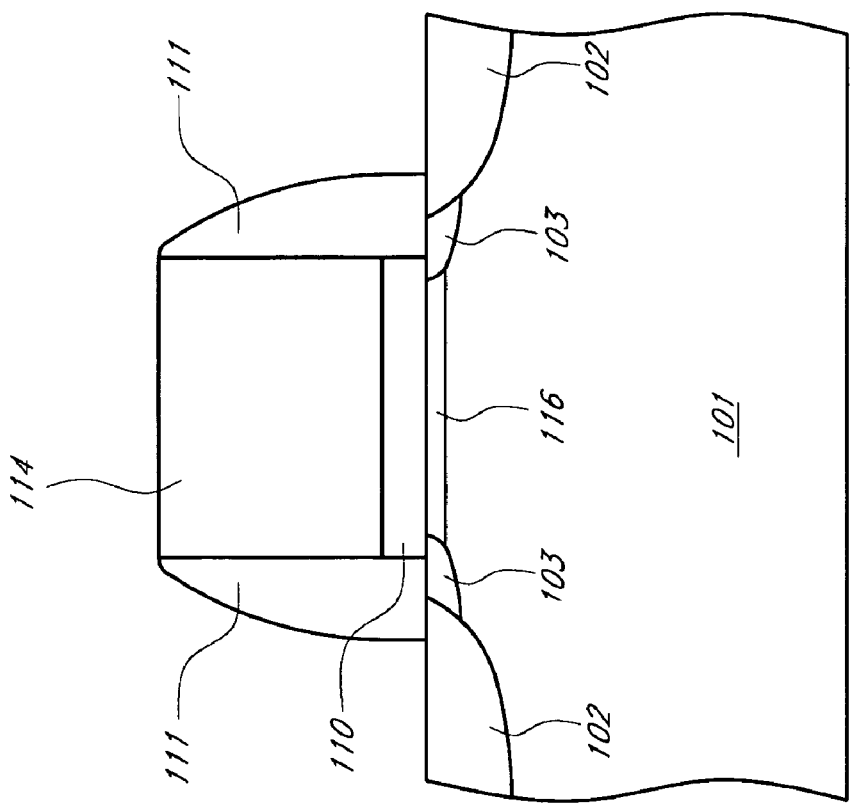
FIG. 1 shows a cross-sectional view of a gate stack in accordance with the prior art.
Figure 2:
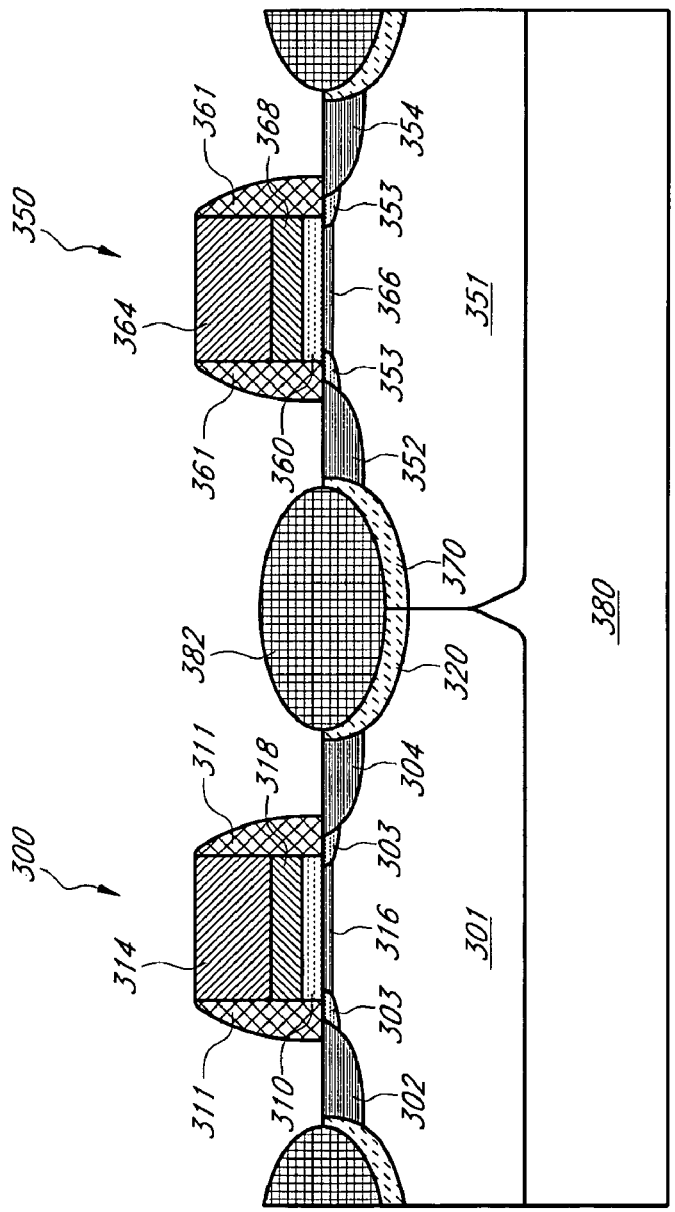
FIG. 2 shows a cross sectional view of a CMOS device in accordance with the prior art.

The disclosed methods will be described in detail by way of preferred embodiments with reference to accompanying drawings. Although described in the context of certain preferred embodiments, the skilled artisan will appreciate, in view of the disclosure herein, that the materials, methods and structures described herein will have a variety of other applications.

According to preferred embodiments of the invention, metallic-compound films or thin films comprising a metal or a plurality of metals and at least one other species desired in the film (e.g., carbon, nitrogen, oxygen, or silicon) are formed by a plasma-enhanced atomic layer deposition (PEALD) process. The stoichiometry, hence the composition of the films is selected based upon plasma parameters during film deposition. By selecting plasma parameters during film deposition, non-stoichiometric metallic-compound films, preferably metal-rich metallic-compound films, may be formed with compositions as desired. Such films may be employed in gate electrodes in a gate stack structure, for example. In this case, by controlling the composition of the gate electrode, the gate stack work function can be selected as desired.

A method of forming gate electrodes is described in U.S. Patent Application 2004/0106261, the disclosure of which is entirely incorporated herein by reference. The overall work function of the gate electrode is tuned to a desired value by modifying the composition of the deposited film. The composition is modified by introducing into the gate electrode an additional material (e.g., oxygen) having higher or lower electronegativity. In contrast, embodiments described herein achieve composition control by selecting plasma parameters. In one embodiment, relationships are established between plasma parameters and film composition and plasma parameters can then be selected from such established relationships to deposit films of a desired composition. In other embodiments, the composition of a film deposited over a dielectric can be tailored to yield a work function of a gate stack as desired (i.e., predetermined work function).

In preferred embodiments, metallic-compound films or thin films with compositions selected as desired are formed over a substrate using plasma-enhanced atomic layer deposition (PEALD). The inventor has observed that composition control can be achieved by adjusting the oxidation state(s) of a metal (or a plurality of metals) in the film. Metal atoms of lower oxidation states will bond to fewer atoms of another species desired in the film, which results in the metallic-compound film having an increased metal content (i.e., the film is metal rich) relative to a film in which the metal has a higher oxidation state. As an example, with respect to TiN and $Ti_3N_2$ films, the latter has a higher metal content relative to the former.

In a plasma enhanced atomic layer deposition (PEALD) process, the oxidation state of a metal (or a plurality of metals) can be adjusted by contacting a substrate with a suitable reducing agent, such as plasma-excited hydrogen ($H_2$) species, during the deposition sequence. By selecting appropriate plasma parameters, a compound film with composition as desired can be formed.

In the context of the present description, an "ALD process" or "ALD type process" generally refers to a process for producing films or thin films over a substrate in which a thin film is formed atomic or molecular monolayer-by-monolayer (ML) due to self-saturating chemical reactions. The general principles of ALD are disclosed, e.g., in U.S. Pat. Nos. 4,058, 430 and 5,711,811, the disclosures of which are incorporated herein by reference. In an ALD process, gaseous reactants, i.e., precursors or source materials, are alternately and sequentially conducted into a reaction space of an ALD reactor where they contact a substrate located in the chamber to provide a surface reaction. Consequently, typically only up to one monolayer (i.e., an atomic layer or a molecular layer) of material is deposited at a time during each temporally and spatially-separated pulsing cycle. Gas phase reactions between precursors and any undesired reactions of by-products are inhibited because precursor pulses are separated from each other by time and the reaction chamber is evacuated using a purge gas (e.g., nitrogen, argon, and/or hydrogen) and/or a pumping system between precursor pulses to remove surplus gaseous reactants and reaction by-products from the chamber.

"Plasma-excited species" refers to radicals, ions or other excited species generated via application of energy to a gas. Plasma-excited species may be generated using a direct plasma generator (i.e., "in situ" or "direct" plasma generation) and/or a remote plasma generator (i.e., "ex situ" or "remote" plasma generation). Energy may be applied (or coupled) to a gas via a variety of methods, such as inductive coupling, ultraviolet radiation, microwaves, capacitive coupling, application of RF power, etc. In the absence of coupling energy, plasma generation is terminated. Plasma-excited species include, without limitation, hydrogen and nitrogen radicals.

"Plasma parameters" is used to designate one or more plasma generation variables, including, without limitation, plasma generator power, gas pressure, gas (or reactant) flow rate, and plasma pulse duration. As an example, for plasma generation using RF power, plasma parameters include, without limitation, radio frequency (RF) power on time, RF power amplitude, RF power frequency or frequencies (for dual frequency systems), reactant concentration, reactant flow rate, reaction space pressure, total gas flow rate, reactant pulse durations and separations, and RF electrode spacing.

A "PEALD process" refers to a process for producing films or thin films over a substrate in which a thin film is formed monolayer by monolayer due to self-saturating chemical reactions, such as adsorption of a source chemical (e.g., metal source chemical) and reaction between adsorbed species and plasma-excited species.

"Reaction space" is used to designate a reactor or reaction chamber ("chamber"), or an arbitrarily defined volume therein, in which conditions can be adjusted to effect thin film growth. Typically the reaction space includes surfaces subject to all reaction gas pulses from which gases or particles can flow to the substrate, by entrained flow or diffusion, during normal operation. The reaction space can be, for example, in a single-wafer plasma enhanced ALD (PEALD) reactor or a batch PEALD reactor, where deposition on multiple substrates takes place at the same time. PEALD reactors include, without limitation, EmerALD™ and Pulsar™ reactors available commercially from ASM America, Inc. of Phoenix, Ariz.

"Substrate" can include any workpiece that is suitable for integrated circuit (IC) fabrication. Typical substrates include, without limitation, semiconductors (e.g., silicon wafers) and insulators (e.g., glass substrates). "Substrate" is meant to encompass bare substrates as well as partially fabricated substrates with layers and patterns formed thereon, including one or more layers formed in prior ALD cycles.

"Surface" is used to designate a boundary between the reaction space and a feature of the substrate.

"Thin film" refers to a film that is grown from elements or compounds that are transported as separate ions, atoms or molecules via vacuum, gaseous phase or liquid phase from the source to the substrate. The thickness of the thin film depends upon the application and may vary in a wide range, preferably from one molecular layer to 30 nanometers (nm)

"Metal rich" refers to any film or thin film comprising a metal or plurality of metals and at least one non-metallic species bonded to the metal or plurality of metals, wherein the film is defined by a stoichiometric ratio between the metal (or plurality of metals) and the non-metallic species, the ratio being greater than one, preferably substantially greater than one. In a metal-rich film, the total number of metal atoms is greater than the total number of atoms defined by the non-metallic species. In some embodiments, a binary (two species) metallic-compound film can be generally defined by $M_xE_y$, wherein 'M' is a metal, 'E' is a non-metallic species, such as, e.g., carbon, nitrogen, or oxygen, and 'x' and 'y' are numbers, wherein for a metal-rich binary compound 'x' is greater than 'y'. A ternary (three species) compound may include one metal and two non-metals or two metals and one non-metal. For example, a ternary compound may be defined by $M_xE_yF_z$, wherein 'M' is a metal, 'E' and 'F' are dissimilar, preferably non-metallic species (e.g., carbon and nitrogen), and 'x', 'y' and 'z' are numbers, wherein for a metal-rich ternary compound 'x' is greater than the sum of 'y' and 'z'. As another example, a ternary compound may be defined by $M^1_xM^2_yE_z$, wherein 'M$^1$' is a first metal, 'M$^2$' is a second metal, E is a non-metallic species, and 'x', 'y' and 'z' are numbers, wherein for a metal-rich ternary compound the sum of 'x' and 'y' is greater than 'z'.

"Metallic-compound film" or "metal-containing film" refers to any film comprising a metal or plurality of metals (i.e., metal alloy) and at least one other non-metallic species.

"Oxidation state" refers to the degree of oxidation of an atom, represented by a positive or negative number. As an example, the oxidation states of 'Ti' and 'N' in a $Ti_3N_2$ five-atom cluster are '+2' and '−3', respectively. The oxidation state of 'Ti' in this case is reduced relative to the oxidation state of 'Ti' in the precursor $TiCl_4$, which is +4. It should be understood that the oxidation state of a metallic-compound film is averaged over all of the oxidation states of the constituent atoms.

Film Composition as a Function of Plasma Parameters

According to preferred embodiments, metal-rich metallic-compound films, such as gate electrodes, are formed by a plasma enhanced atomic layer deposition (PEALD) process. Preferred methods include selecting plasma parameters to deposit a film or thin film of composition that can be established from relationships between plasma parameter(s) and film composition. That is, film composition is controlled as a function of plasma parameters.

In preferred embodiments, deposition recipes for metallic-compound films or thin films are determined or designed by selecting plasma parameters. As an example, the RF power may be selected to effect a film or thin film stoichiometry as desired. As another example, the desired composition may be achieved by selecting a particular plasma pulse duration. As still another example, the desired composition may be achieved by selecting a combination of RF power, reactant pulse duration and reactant flow rate.

According to preferred embodiments, plasma parameters are selected from relationships that have been established between plasma parameters and film composition. "Plasma parameters" may include one plasma parameter, such as RF power, or multiple plasma parameters, i.e., a set of plasma parameters, such as RF power and RF frequency. Plasma parameters are selected to yield a metallic-compound film with composition as desired. In preferred embodiments, plasma parameters are selected to yield a metal-rich metallic-compound film. In some cases plasma parameters are selected to form a gate electrode with a particular composition to yield a desired gate stack work function.

Relationships between plasma parameters and metallic-compound film or thin film composition can be established by selecting plasma parameter(s) and depositing a metallic-compound film by a plasma-enhanced atomic layer deposition (PEALD) process using the selected plasma parameter(s) until a film of desired thickness is formed. The film composition can then be determined and another film of thin film deposited using a different plasma parameter (or parameters). This process can be repeated for different values of the plasma parameter(s) to develop relationships between the plasma parameter(s) and film composition.

Figure 3:
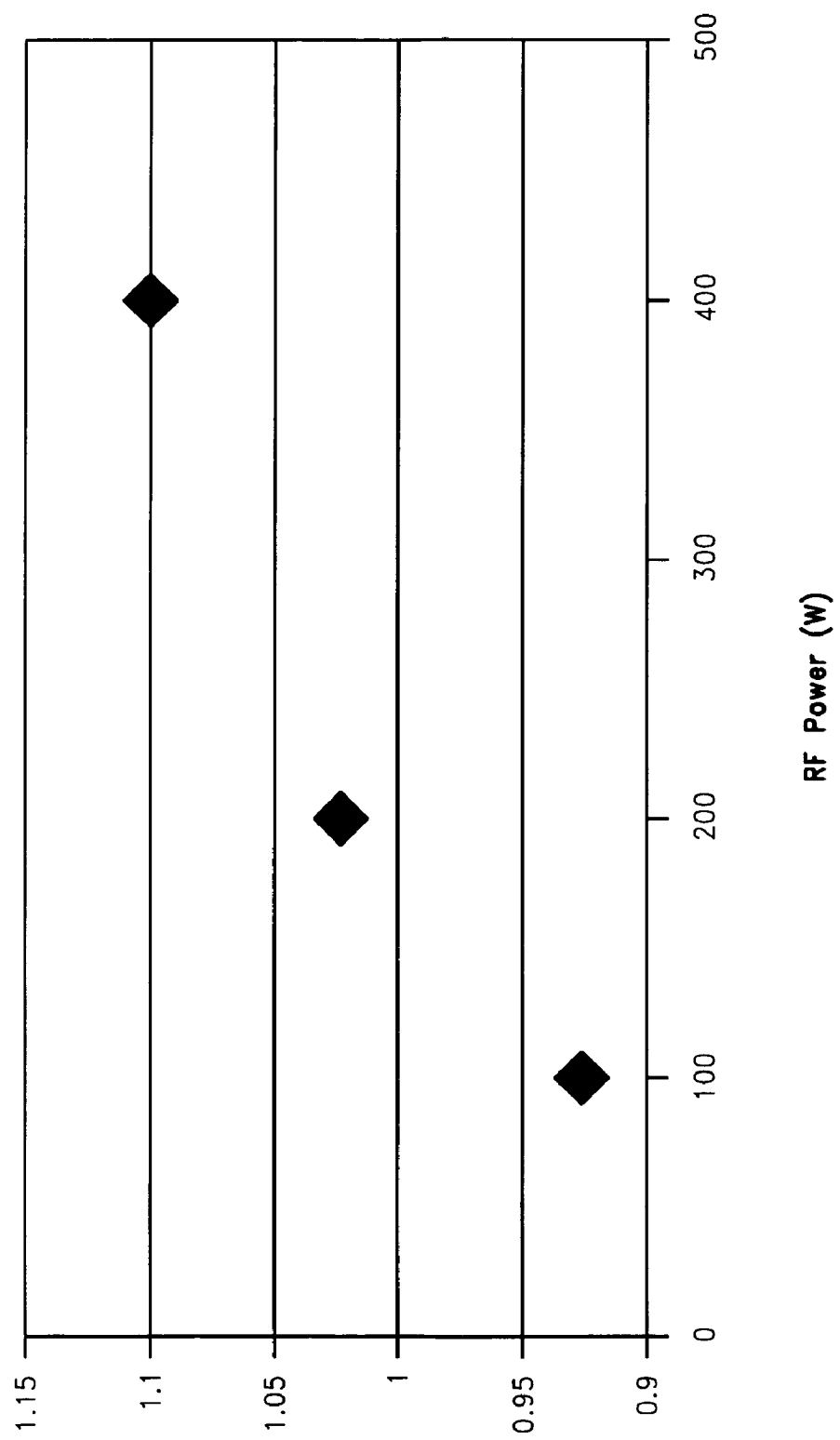
FIG. 3 is a two-dimensional plot of titanium-nitride film composition as a function of RF power (W) for a plasma enhanced atomic layer deposition (PEALD) process, in accordance with a preferred embodiment of the invention.
Figure 4:
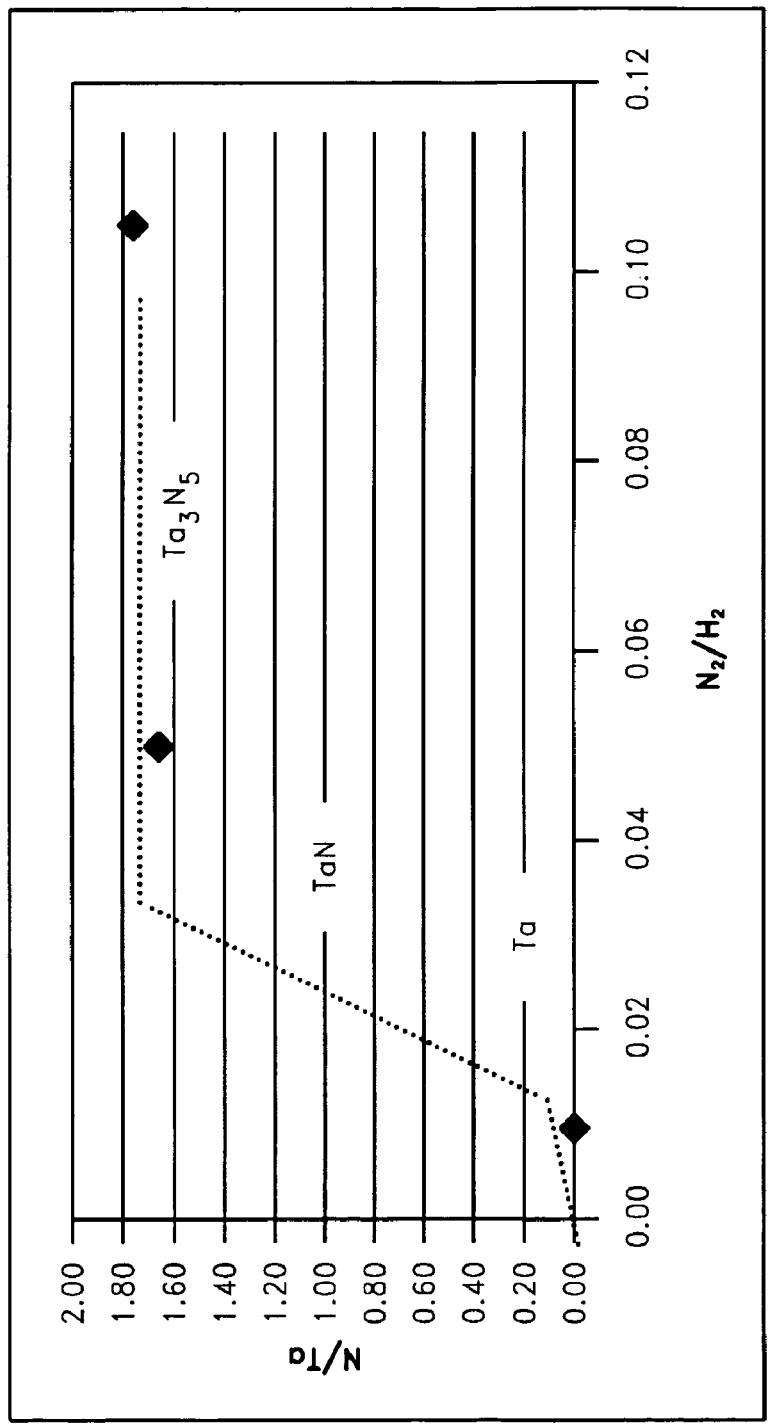
FIG. 4 is a two-dimensional plot of tantalum-nitride film composition as a function of a ratio between nitrogen ($N_2$) and hydrogen ($H_2$) flow rates for a PEALD process, in accordance with a preferred embodiment of the invention.

FIGS. 3 and 4 show established relationships between metal nitride film composition (denoted by a N/Ti or N/Ta stoichiometric ratio) and plasma parameters. An RF plasma generator was used to generate plasma-excited species. FIG. 3 is a two-dimensional plot depicting a relationship between titanium-nitride (also denoted by "TiN" herein) film composition and RF power (watts). In FIG. 3, TiN films were formed by PEALD using alternating and sequential pulses of $TiCl_4$ and an $H_2/N_2$ plasma in a 300-mm single wafer reactor by ASM International, Inc. During TiN deposition, the deposition temperature was about 320° C., the RF frequency for the in situ plasma generator was about 13.56 MHz, the RF pulse duration was about 3 seconds, and the reactor pressure was about 3 torr. The composition of the films formed was varied by selecting different RF powers. FIG. 4 is a two-dimensional plot depicting a relationship between tantalum-nitride film composition and a ratio between hydrogen ($H_2$) and nitrogen ($N_2$) vapor flow rates ("$N_2/H_2$", as illustrated). In FIG. 4, the deposition temperature was 300° C., the RF frequency was about 13.56 MHz, the RF pulse duration was about 2 seconds and the reactor pressure was about 3 torr. It can be seen that a deposited tantalum-nitride film is substantially metal rich (i.e., nearly metallic) when the flow rate ratio is below 0.03 ($H_2$: 102 sccm and $N_2$: 3 sccm). When the ratio is increased to 0.05 ($H_2$: 100 sccm and $N_2$: 5 sccm), the N/Ta ratio corresponds to $Ta_3N_5$, where tantalum has an oxidation state of +5.

Plasma parameters such as those listed above can modulate the extent of reduction of adsorbed metal species, and thus the average oxidation state of the metal in a metallic-compound film. The oxidation state, in turn, affects the composition of the film. Consequently, by selecting plasma parameters, composition control of metallic-compound films can be achieved.

Depositing Metallic-Compound Films

According to preferred methods, a metallic-compound film is deposited with a predetermined composition by selecting plasma parameters in a plasma-enhanced atomic layer deposition (PEALD) process. This may include, e.g., selecting RF power or ratio of gas flow rates using relationships such as those depicted in FIGS. 3 and 4.

PEALD methods described herein can be employed to form components of gate stacks, such as gate electrodes, or any metallic-compound film where composition control, i.e., an ability to predictably form metal compounds of particular composition, particularly non-stoichiometric, is desirable. In forming gate stacks, plasma parameters can be selected to form gate electrodes of desired composition, which will in turn dictate the gate stack work function.

The process for the formation of controlled-composition compound films preferably comprises an atomic layer deposition type process, including an alternating and repeated exposure of the substrate to spatially and temporally separated vapor phase pulses of at least two reactants, so that a compound film of at least binary composition is formed. In preferred embodiments, the at least two reactants comprises a metal source chemical (or precursor of a metal) and a plasma-excited species. In some embodiments, the at least two reactants may include a third reactant comprising a species incorporated into the film.

The metallic-compound film comprises at least one metal and at least one other non-metal species, such as carbon, nitrogen, or oxygen. The metal has an oxidation state reduced (or lowered) relative to an oxidation state of a precursor used to deposit the metal. For example, if the precursor is $TiCl_4$, where the oxidation state of Ti is +4, the oxidation state of a Ti atom in the deposited metal-rich metallic-compound film is preferably lower than +3. In preferred embodiments, the oxidation state of a metal atom in the metallic-compound film is lower than +3 and higher than 0. In some cases, the oxidation state of the metal atom may be lower than +2.

The oxidation state (an integer) of individual metal atoms will dictate the composition of individual metallic-compound molecules. However, the average oxidation state and the composition of the metallic-compound film, which are averaged over all of the metal atoms in the film, can have fractional values.

According to preferred embodiments of the invention, metallic-compound films are deposited in a "three-step" or "two-step" process. A three-step method comprises contacting a substrate in a reaction space with alternating and sequential pulses of a metal source chemical, second reactant and third reactant, where one of the reactants is plasma activated. In accordance with ALD principles, reactant pulses are separated spatially and temporally, such as by purge steps. A two-step method comprises contacting a substrate in a reaction space with alternating and sequential pulses of a metal source chemical and second reactant.

In preferred embodiments, the metal-rich metallic-compound film to be formed comprises a metal selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), osmium (Os) and combinations thereof. In some embodiments, the metal source chemical is a halide and the deposited monolayer is terminated with halogen ligands. For example, the metal compound can be selected from the group consisting of metal bromides, metal chlorides, metal fluorides and metal iodides. For example, the metal source chemical may be selected from the group consisting of $TiBr_w$, $TiCl_x$, $TiF_y$, and $TiI_z$, where w, x, y, and z are integers from 1 to 6. In other embodiments, a metallic-compound film may be formed by contacting the substrate with a metal organic compound, such as a metal dialkylamido or metal cyclopentadienyl compound. In some embodiments, where the metallic-compound film comprises a plurality of metals, the metal source chemical may comprise a plurality of metals. As an example, the metal source chemical may be a mixture of source chemicals of individual metals (e.g., $TiCl_4$ and $WF_6$). In such a case, pulsing parameters (e.g., flow rates) may be selected to effect a predetermined proportion of metals in the metallic-compound film.

Figure 5:
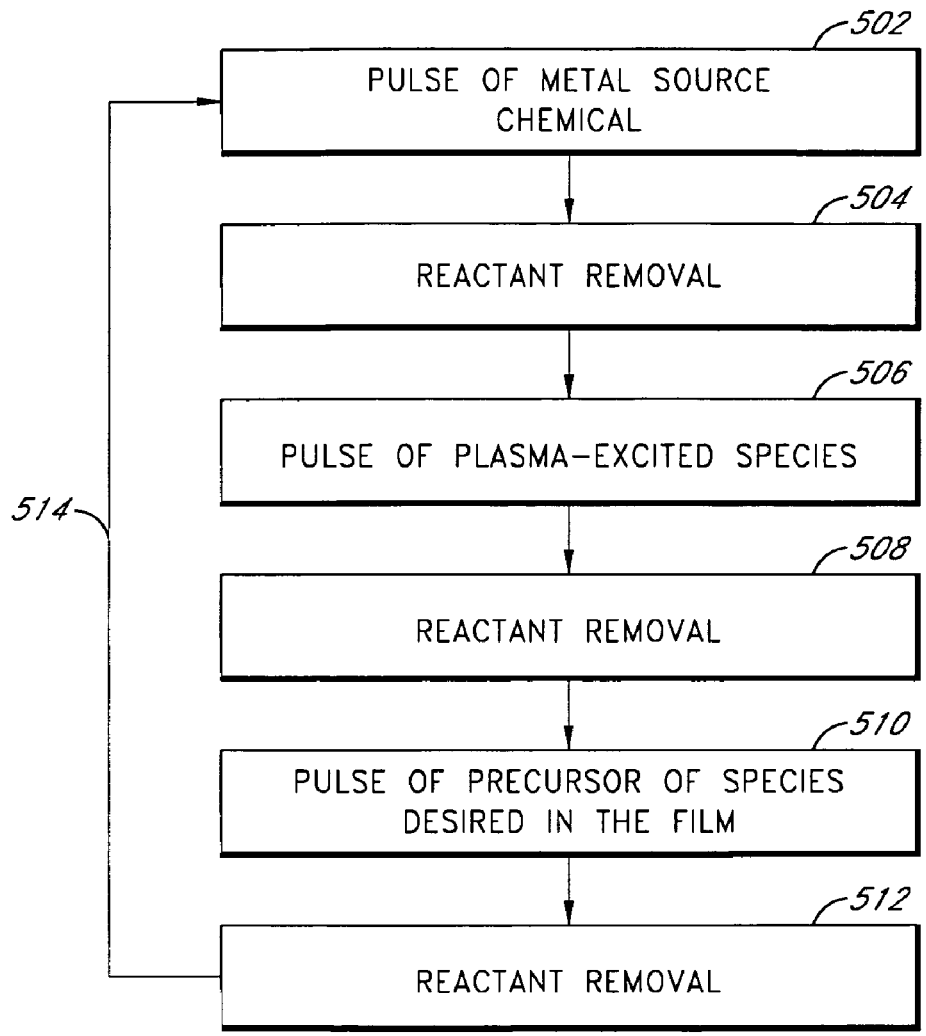
FIG. 5 is a block diagram of a pulsing sequence, in accordance with a preferred embodiment of the invention.

With reference to FIG. 5, in a "three-step" embodiment of the invention, steps of forming a metal-rich compound film or thin film by a PEALD process are illustrated. After initial surface termination, if necessary, a first reactant or source material is supplied or pulsed 502 to a substrate or workpiece in a reaction space. In accordance with a preferred embodiment, the first reactant pulse comprises a carrier gas flow and a volatile halide species that is reactive with the workpiece surfaces of interest and further comprises a metal species that is to form part of the deposited layer. In the illustrated embodiment, the first reactant is a metal source chemical comprising a metal having a first oxidation state. Accordingly, a halogen-containing species (or metal-containing species) adsorbs upon the workpiece surfaces, forming a metal-containing film or thin film. The metal-containing film comprises a metal having a second oxidation state. In the illustrated embodiment, the first reactant is a metal source chemical, such as a metal halide, and the thin film being formed comprises a metallic-compound material, such as a metal carbide, metal nitride, metal oxide, or a metal carbide-nitride. The first reactant pulse self-saturates the workpiece surfaces such that any excess constituents of the first reactant pulse do not further react with the monolayer formed by this process. Self-saturation is due to halide tails terminating the monolayer, protecting the layer from further reaction.

The first reactant is then removed (or evacuated) 504 from the reaction space. Preferably, step 504 merely entails stopping the flow of the first reactant or chemistry while continuing to flow an inert carrier gas (e.g., Ar, $H_2$ and/or $N_2$) for a sufficient time to diffuse or purge excess reactants and reactant by-products from the reaction space, preferably with greater than about two reaction chamber volumes of the purge gas, more preferably with greater than about three chamber volumes. Preferably, the removal 504 comprises continuing to flow purge gas for between about 0.1 seconds and 20 seconds after stopping the flow of the first reactant pulse. Inter-pulse purging is described in a co-pending U.S. patent application, having Ser. No. 09/392,371, filed Sep. 8, 1999 and entitled IMPROVED APPARATUS AND METHOD FOR GROWTH OF A THIN FILM, the disclosure of which is incorporated herein by reference. In other arrangements, the chamber may be pumped down between alternating chemistries. See, for example, PCT publication number WO 96/17107, published Jun. 6, 1996, entitled METHOD AND APPARATUS FOR GROWING THIN FILMS, the disclosure of which is incorporated herein by reference. Together, the adsorption 502 and reactant removal 504 represent a first phase in an ALD-type cycle. The first phase in the illustrated ALD-type cycle is also a "metal phase".

With continued reference to FIG. 5, a second reactant or source chemical is pulsed 506 to the workpiece. The second reactant desirably reacts with the monolayer left by the first reactant. In the illustrated embodiment, the second reactant is a plasma-excited species, such as a plasma excited species of hydrogen ($H_2$). Plasma-excited species of hydrogen may include, without limitation, electrically neutral hydrogen radicals (H*) and cations ($H^+$). The second reactant pulse 506 comprises generating plasma in the reactor or supplying plasma formed remotely. The plasma-excited species of hydrogen preferably reduces the oxidation state of the metal in the metal-containing film formed in the metal phase. This step may include removing halide atoms from the monolayer deposited in the metal phase. Plasma parameters are selected to effect a desired oxidation state in the metal (or plurality of metals) but in the illustrated embodiment this reactant pulse 506 does not contribute atoms for incorporation into the film.

After a time period sufficient to reduce the metal-containing film to a desired oxidation state, plasma generation is terminated and any reaction by-products (preferably also volatile) are removed 508 from the reaction space, preferably by a purge gas. The removal can be as described for step 504. Together, steps 506 and 508 represent a second phase of the illustrated PEALD process, which can also be referred to as the "reduction phase". The reduction phase preferably produces a reduced metal-containing film comprising a metal, the metal having a second oxidation state, the second oxidation state being lower than the first oxidation state.

With continued reference to FIG. 5, a third reactant or source chemical is pulsed 510 to the workpiece. The third reactant desirably reacts with the monolayer left by the second reactant and deposits a species desired in the film formed in the reduction phase. If a metal-nitride film or thin film is desired, the third reactant is a nitrogen-containing compound, such as ammonia ($NH_3$) or hydrazine ($N_2H_4$); if a metal carbide thin film is desired, the third reactant is a carbon-containing compound, such as an alkane, alkene, or alkyne; and if a metal-oxide film is desired, the third reactant is an oxidizing (oxygen-containing) compound, such as oxygen ($O_2$) or water ($H_2O$). In the illustrated embodiment, the third reactant is a nitrogen-containing species and a metal-rich metal-nitride film is to be formed.

The third source chemical reacts with the film left in the second phase in a self-saturating manner. The extent of incorporation (or reaction) of the third source chemical depends on the extent of reduction in the second phase, which, in turn, depends on the selected plasma parameters. As such, the concentration of the species desired in the film is dependent on the selected plasma parameters.

After a time period sufficient to react with the metal-containing film, pulse of the third reactant is terminated and any reaction by-products (preferably also volatile) are removed 512 from the reaction space, preferably by a purge gas. The removal can be as described for step 504. Together, steps 510 and 512 represent a third phase of the illustrated PEALD process, which can also be referred to as the "species-contributing phase".

Together, steps 502-512 define a cycle of the PEALD process. A typical PEALD process may include one cycle or multiple cycles to form a metal-rich metallic-compound layer of desired thickness and/or composition. If multiple cycles are desired, steps 502-512 may be repeated 514. In some embodiments, the metal phase is repeated several times prior to the step of providing the plasma-excited species. In other embodiments, the metal phase and/or reduction phase are repeated several times prior to the step of providing the third reactant. If steps 502-512 are repeated 514, the plasma parameters can be changed or kept constant from one cycle to the next. Plasma parameters can be changed (or modulated) to form a graded metallic-compound film. Plasma parameters can be kept constant to form a metallic-compound film of uniform composition.

Preferably, the same metal source chemical is used from one cycle to the next. However, it would be appreciated that different metal source chemicals may be used in different cycles.

In some embodiments, the species-contributing phase precedes the reduction phase. In such a case, the species desired in the film may be pulsed as a plasma-excited species. For example, the step following the metal phase may be a pulse of a plasma-excited species of a species desired in the film, such as, e.g., $NH_3$ if a metal-nitride film is desired.

In some embodiments, plasma parameters are selected as desired (or pre-determined) and kept fixed between at least two cycles. In other embodiments, plasma parameters are changed between at least two cycles to form a metal film or thin film with a graded composition.

In an alternative "two step" embodiment of the invention (not shown), following the metal phase, a vapor phase pulses of a second reactant is pulsed into the reaction space. The second reactant (or source chemical) may be a plasma-excited species, a mixture of plasma-excited species, or a mixture of plasma and non-plasma excited (i.e., neutral) species. In preferred embodiments, plasma parameters are selected to obtain a desired composition (e.g., to achieve a desired work function) and are typically selected to form a metal-rich metallic-compound film.

In the two-step embodiment, the second reactant may be a vapor phase mixture of a reducing agent and a species desired in the film. For example, the second reactant may be a mixture of plasma-excited species of hydrogen ($H_2$) and nitrogen ($N_2$). In some embodiments, the second reactant may be a plasma-excited species of a nitrogen-containing compound, such as ammonia ($NH_3$) or hydrazine ($N_2H_4$).

Pulsing the second reactant can include feeding a constant supply of gas into the reaction space and intermittently pulsing plasma power using the selected plasma parameters. For example, following the metal phase, $H_2$ and $N_2$ may be fed into the reaction space and plasma power turned on and off intermittently to generate a metal-nitride film of desired composition.

After a time period sufficient to form a metallic-compound film (monolayer), the pulse of the second reactant is terminated and any reaction by-products are removed from the reaction space, preferably by a purge gas. The removal can be as described for step 504 in the context of FIG. 5.

Gate Stack

Preferred embodiments of the invention can be used to form gate electrodes, the gate electrodes being components of gate stacks in NMOS or PMOS transistors. The overall work function of gate stacks can be tuned by selecting the compositions of the gate stacks, preferably comprising metal-rich metallic-compound films.

Figure 6:
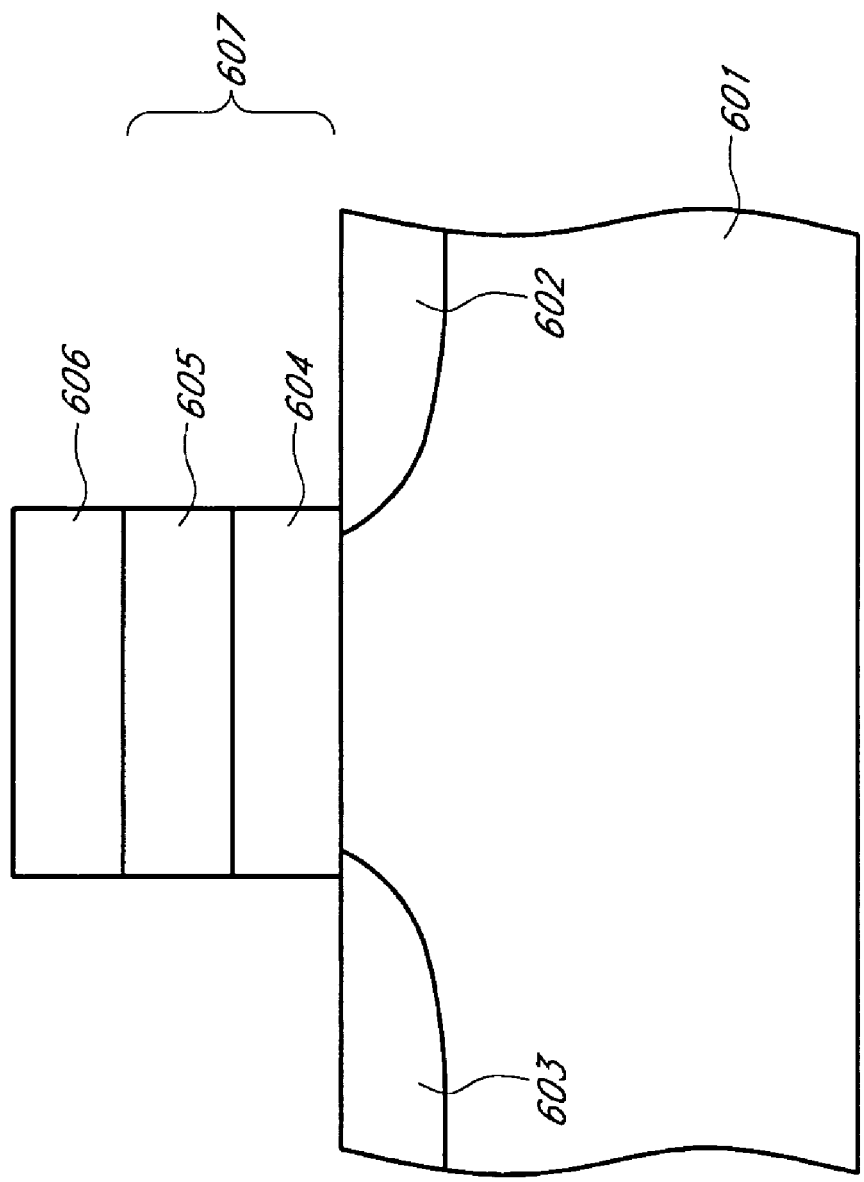
FIG. 6 shows a cross-sectional view of a gate stack, in accordance with a preferred embodiment of the invention.

FIG. 6 shows a gate stack structure in accordance with preferred embodiments of the invention. It will be appreciated that the figure and component parts there (i.e., layers) are not necessarily drawn to scale. Preferred methods include depositing a gate dielectric layer 604 over a substrate 601, and depositing gate electrode layer 605 over the gate dielectric layer 604. The gate dielectric 604 and gate electrode 605 collectively define a gate stack 607, which can also include a more metallic strap 606 for lateral signal propagation and/or a dielectric cap (not shown), and might include a barrier layer (not shown) between the gate dielectric 604 and the gate electrode 605, as disclosed in U.S. Publication No. 2004/0106261, published Jun. 3, 2004, the disclosure of which is incorporated herein by reference. The substrate may be a semiconductor, such as p- or n-type silicon. The substrate 601 comprises source/drain regions 602, 603, typically defined in a self-aligned way after patterning the gate electrode stack 607 and forming dielectric sidewall spacers (not shown). The substrate 601 preferably includes one or more layers that modify the surface of the substrate or the interface of the substrate and the gate dielectric layer 604. The gate dielectric 604 may be deposited according to any known thin film deposition technique and can be formed of a high-k material. One preferred high-k material is hafnium oxide ($HfO_2$). In some embodiments, where the gate electrode layer comprises two parts (e.g., upper and lower parts), the more conductive gate electrode strap layer 606 is deposited over the gate electrode layer 605 prior to patterning.

The thickness of gate electrode layer 605 is preferably between about 3 nanometers (nm) and 20 nm, more preferably between about 3 nm and 10 nm The gate electrode layer 605 is preferably deposited by a plasma-enhanced atomic layer deposition (PEALD) process with plasma parameters selected to form a gate electrode of desired composition. The desired composition yields a desired gate stack work function.

The dielectric layer 604 can be deposited by any deposition method know in the art, such as ALD or PEALD. The upper gate electrode layer 606 is preferably deposited by chemical vapor deposition (CVD) type or physical vapor deposition (PVD) type processes. In some embodiments, deposition of the metallic strap layer 606 is performed in a reaction space different from that used to deposit layer 605. For example, the reaction space used to deposit layer 606 may be a PVD chamber.

The materials of the gate dielectric layer 604 and the gate electrode 605 are selected to provide a device having a threshold voltage within a desired range suitable for a thin film transistor. In some embodiments, the gate dielectric layer 604 is an oxide comprising material selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), palladium (Pd), platinum (Pt), silicon (Si), and combinations thereof. For example, the dielectric layer may comprise a layer of hafnium oxide ($HfO_2$) or silicon oxide ($SiO_2$)—

The gate electrode may comprise a layer of a binary compound, such as, e.g., a tantalum nitride, or a ternary compound, such as titanium-carbide-nitride or tantalum-aluminum-nitride. In preferred embodiments, the gate electrode 605 is a compound comprising a metal selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), osmium (Os) and combinations thereof.

In preferred embodiments, the gate electrode 605 is defined by a metal-rich binary or ternary metal-containing compound. The gate dielectric layer 604 and the gate electrode layer 605 are deposited without exposure to air between the deposition steps. The surface of the dielectric layer is preferably provided with favorable active surface sites, such as —OH and/or —$NH_x$ groups. In the preferred embodiment, a negative impact of air exposure on the chemical and physical properties of the lower parts of the device can be avoided by using a single pump down or purge in the deposition of the dielectric layer 604 and the gate electrode 605. The device structure of FIG. 6 is suitable for PMOS and NMOS transistors of CMOS structures.

The gate electrode comprises material with composition selected to yield a desirable gate stack work function. The composition of the gate electrode is selected by choosing (or selecting) plasma parameters during metallic-compound film or thin film deposition by PEALD, as described above. The overall work function of the gate electrode deposited according to the preferred embodiments is tuned to a desired value by modifying the composition of the gate electrode material. In some embodiments, this may entail modifying the composition of the lower layer 605.

Reaction System

Figure 7:
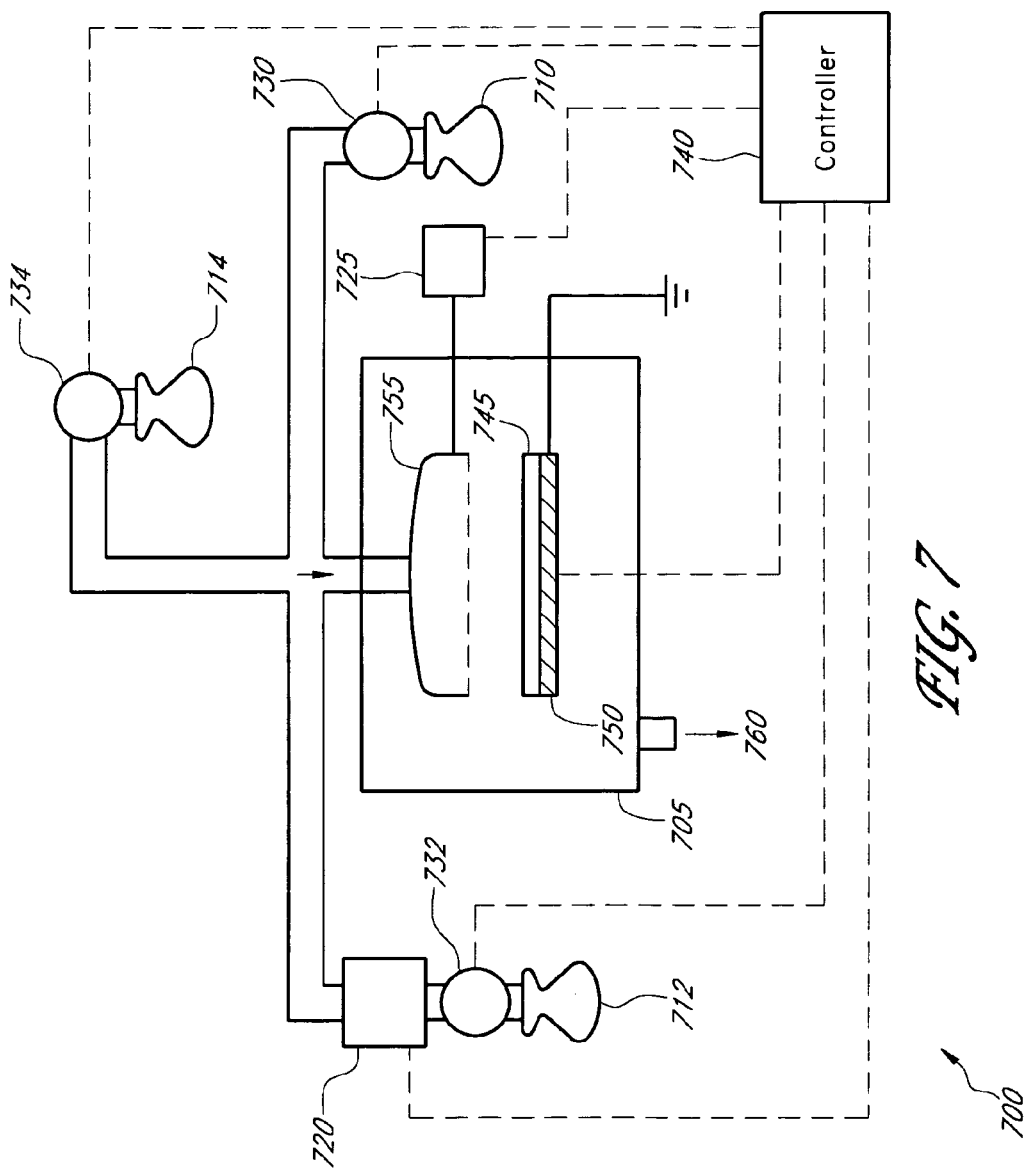
FIG. 7 shows a reactor configured to form metallic-compound films, in accordance with a preferred embodiment of the invention.

A reaction system 700 configured to form a metallic-compound film over a substrate according to methods and processes of preferred embodiments is shown in FIG. 7. The reaction system 700 includes a reaction space 705, vapor (or gas) source vessels ("vessels") 710, 712 and 714, a remote plasma generator 720, a power supply 725 for in situ plasma generation, and valves 730, 732 and 734 upstream of the vapor source vessels 710, 712 and 714, respectively. While illustrated with both remote and in situ plasma sources, it will be understood that the reaction system 700 may be configured for either in situ or remote plasma generation. Remote plasma generators are readily available and may couple, e.g., microwave energy to a flowing gas. Plasma generators can couple various other forms of energy (e.g., ultraviolet, inductive, capacitive, etc) to a gas. The reaction space 705 is preferably configured for plasma-enhanced vapor deposition, more preferably plasma-enhanced atomic layer deposition (PEALD).

In the illustrated embodiment, vessel 710 is configured to provide a metal source chemical; vessel 712 is configured to provide a precursor (e.g., $H_2$, $N_2$, $CH_4$, etc.) of a plasma-excited species; and vessel 714 is configured to provide a source chemical of a species desired in the metallic-compound film, which species can be a metal or a non-metal (e.g., C, N, O). However, it would be appreciated that the vessels 710, 712 and 714 can provide any species in accordance with preferred embodiments of the invention.

The reaction system 700 of the illustrated embodiment is configured to process a substrate 745. The substrate 745 is supported atop a substrate support platform 750, which may be a heated chuck or a susceptor. The illustrated reaction space 705 also comprises a showerhead 755 for uniformly distributing reactants across a top surface of the substrate 745, although other arrangements, such as, e.g., horizontal laminar flow arrangements, are also possible. In cases where in situ plasma generation is desired, the showerhead 755 may also serve as one electrode of the in situ plasma generator and the combination of the substrate 745 and the substrate support platform 750 may serve as the other electrode. In the illustrated embodiment, the showerhead 755 serves as the positive electrode and the combination of the substrate 745 and the substrate support platform 750 (which are grounded) serves as the negative electrode. A showerhead configured for plasma-enhanced atomic layer deposition is described in U.S. Patent Publication No. 2004/0231799, the disclosure of which is incorporated herein by reference in its entirety.

The reaction system 700 further comprises a controller 740 configured to control various aspects of wafer processing, such as pulsing of a metal source chemical, a plasma-excited species and a source chemical of a species desired in a metallic-compound film; wafer temperature; reaction space pressure; reactant(s) and reaction by-product(s) removal; and plasma generation. Preferably, the controller 740 is also configured to control plasma generation parameters, which include, without limitation, radio frequency (RF) power on time, RF power amplitude, RF power frequency, reactant concentration, reactant flow rate, reaction space pressure, total gas flow rate, reactant pulse durations and separations, and RF electrode spacing. It would be appreciated that the controller 740 is configured to control different plasma parameters for various types of plasma generators. Depending on the type of plasma generator (i.e., in situ or remote), different plasma parameters may be controlled by the controller 740. Additionally, the controller is configured to control various vapor source temperatures external to the reaction space 705. The controller 740 may comprise one or more computers configured to communicate with each other and various processing units of the reaction system 700. In the illustrated embodiment, the controller 740 is in communication (dotted lines) with the remote plasma generator 720, in situ plasma generator 725, valves 730, 732 and 734, and one or more heaters and thermocouples (not shown) in the substrate support platform 750. The controller 740 is also configured to control robot movement for loading and unloading a substrate(s) to and from the reaction space 705. The controller 740 is configured to open and close valves 730, 732 and 734. The controller is also configured to control reactant and by-product removal from the reaction space 705 through exit passage 760. Reactant and by-product removal may comprise purging the reaction space 705 with a purge gas and/or pumping with the aid of a pumping system (now shown). Purge gas may be supplied through one of the vapor source vessels 710, 712 and 714, or other passages (not shown) in fluid communication with the reaction space 705. If a source chemical (e.g., metal source chemical, source chemical of a species desired in a metallic-compound film) is pulsed with a carrier gas (e.g., $H_2$, Ar), the carrier gas may serve as the purge gas, and the controller 740 is configured to control the degree of mixing of the source chemical and the carrier gas. In some embodiments, the controller 740 is configured to control a pumping system (not shown).

For in situ plasma generation, gas (or a plurality of gases) is directed from at least one of the vapor source vessels 712, 714 though gas flow passages to the showerhead 755 within the reaction space 705. Application of RF power from the power supply 725 to the showerhead generates plasma-excited species of a gas (or a plurality of gases). The gas is subsequently directed to the top surface of the substrate 745 through openings in the showerhead 755. The controller 740 controls plasma parameters to form a metallic-compound film of predetermined composition as described with respect to the methods above. For remote plasma generation, gas is directed from the vapor source vessel 712 to the remote plasma generator, where plasma-excited species are generated and subsequently directed through gas flow passages to the reaction space 705.

It would be appreciated that several modifications of the reaction system 700 are possible without departing from the scope of the invention. For example, although a showerhead 755 is shown in the reaction space 705, it will be appreciated that the reaction space 705 may include any structure or apparatus for distributing vapor over the substrate 745. As another example, the reaction system 700 may include more than two gas flow passages for directing vapor into the reaction space 705. As yet another example, the reaction space 705 may be configured to process a plurality of substrates. As yet another example, the reaction system 700 may include any number and configuration of vapor source vessels and valves. For instance, the reaction system 700 may include five source vessels in communication with the reaction space 705. As yet another example, although the reaction space 705, as illustrated, is configured to accommodate a single wafer 745, it will be appreciated that the reaction space 705 may be a batch reactor configured to process multiple wafers at a time.

Preferably, the system 700, particularly the controller 740, is programmed or otherwise configured to conduct the processes described herein, employing tailored plasma parameters to achieve tailored composition of metallic-compound films (e.g., to control the work function of a transistor gate electrode).

In at least some of the aforesaid embodiments, any element used in an embodiment can interchangeably be used in another embodiment unless such a replacement is not feasible.

It will be appreciated by those skilled in the art that various other omissions, additions and modifications may be made to the methods and structures described above without departing from the scope of the invention. All such modifications and changes are intended to fall within the scope of the invention, as defined by the appended claims.

I claim:

1. A method of depositing a metallic-compound film in a plasma-enhanced atomic layer deposition (PEALD) process, comprising:

alternately and sequentially contacting a substrate in a reaction space with spatially and temporally separated vapor phase pulses of at least three different reactants, the at least three different reactants comprising:

a metal source chemical;

a plasma-excited species; and a source chemical of a non-metal species desired in the metallic-compound film, wherein plasma parameters for generating the plasma-excited species are selected to reduce the oxidation state of the metal in the metallic-compound film relative to its oxidation state in the metal source chemical and achieve the metallic-compound film with a predetermined composition.

2. The method of claim 1, wherein alternately and sequentially contacting comprises the steps of:

a) selecting plasma parameters;

b) feeding a vapor-phase pulse of the metal source chemical into the reaction space;

c) feeding into the reaction space a vapor-phase pulse of one of the plasma-excited species and the source chemical of the non-metal species desired in the metallic-compound film;

d) feeding into the reaction space a vapor-phase pulse of the other of the plasma-excited species and the source chemical of the non-metal species desired in the metallic-compound film; and e) repeating steps a) through d) in a plurality of cycles to form the metallic-compound film over the substrate.

3. The method of claim 2, wherein the species desired in the metallic-compound film is carbon.

4. The method of claim 3, wherein the source chemical of the species desired in the metallic-compound film is selected from the group consisting of alkanes, alkenes and alkynes.

5. The method of claim 2, wherein the species desired in the metallic-compound film is oxygen.

6. The method of claim 5, wherein the source chemical of the species desired in the metallic-compound film is selected from the group consisting of water ($H_2O$) and oxygen ($O_2$).

7. The method of claim 2, wherein the species desired in the metallic-compound film is selected from the group consisting of carbon, nitrogen, oxygen and combinations thereof.

8. The method of claim 2, further comprising removing reactants and any reaction by-products from the reaction space after each of the vapor phase pulses.

9. The method of claim 8, wherein removing comprises purging the reaction space with the aid of an inert gas.

10. The method of claim 8, wherein removing comprises pumping the reaction space.

11. The method of claim 2, wherein the species desired in the metallic-compound film is nitrogen.

12. The method of claim 11, wherein the source chemical of the species desired in the metallic-compound film is selected from the group consisting of ammonia ($NH_3$), hydrazine ($N_2H_4$), and mixtures thereof.

13. The method of claim 1, wherein the metallic-compound film includes metal selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), osmium (Os) and combinations thereof.

14. The method of claim 1, wherein the metallic-compound film is metal-rich.

15. The method of claim 1, wherein plasma-excited species is selected from the group consisting of excited species of hydrogen ($H_2$), nitrogen ($N_2$), ammonia ($NH_3$) and combinations thereof.

16. The method of claim 1, wherein the metal source chemical is selected from the group consisting of metal halides and metal organic compounds.

17. The method of claim 16, wherein the metal source chemical is selected from the group consisting of metal bromides, metal chlorides, metal fluorides and metal iodides.

18. The method of claim 16, wherein the metal source chemical is selected from the group consisting of metal dialkylamido and metal cyclopentadienyl compounds.

19. The method of claim 1, wherein the species desired in the metallic-compound film is selected from the group consisting of carbon (C), nitrogen (N), oxygen (O) and combinations thereof.

20. The method of claim 1, wherein the plasma parameters are selected from the group consisting of plasma generator power, gas pressure, gas flow rate, plasma generation time and plasma pulse duration.

21. The method of claim 1, wherein plasma-excited species includes excited species of hydrogen ($H_2$).

22. The method of claim 1, wherein plasma-excited species includes excited species of nitrogen ($N_2$).

23. The method of claim 1, wherein plasma-excited species includes excited species of hydrogen ($H_2$) and nitrogen ($N_2$).

24. The method of claim 1, wherein plasma-excited species includes excited species of ammonia ($NH_3$).

25. A reaction system comprising the reaction space and a controller configured to perform the method of claim 1.

26. An atomic layer deposition (ALD) process for growing a thin metallic-compound film, comprising alternately and sequentially contacting a substrate in a reaction space with spatially and temporally separated vapor phase pulses of:

a precursor of a metal that forms no more than about one monolayer of adsorbed species on an exposed surface of the substrate, the adsorbed species comprising at least one type of metal;

a plasma-excited species reacting with the metal; and a source chemical of a species to be incorporated in the thin metallic-compound film, wherein plasma parameters for generating the plasma-excited species are selected such that the stoichiometric ratio between the metal and the species in the thin metallic-compound film is greater than one.

27. The process of claim 26, wherein the thin metallic-compound film comprises a gate electrode.

28. The process of claim 27, wherein the plasma parameters are selected to achieve a predetermined gate electrode work function.

29. The process of claim 26, wherein the plasma parameters are selected from the group consisting of plasma generator power, gas pressure, gas flow rate, plasma generation time and plasma pulse duration.

30. The process of claim 26, wherein plasma-excited species is selected from the group consisting of excited species of hydrogen ($H_2$), nitrogen ($N_2$), ammonia ($NH_3$), hydrazine ($N_2H_4$) and combinations thereof.

31. The process of claim 26, wherein the thin metallic-compound film is metal-rich.

32. The process of claim 26, wherein the source chemical is selected from the group consisting of nitrogen-containing compounds, carbon-containing compounds, oxygen-containing compounds and combinations thereof.

* * * * *